(12) United States Patent
Kula et al.

(10) Patent No.: US 10,858,755 B2
(45) Date of Patent: Dec. 8, 2020

(54) NANOCOMPOSITE BASED ON GRAPHENE FOR REVERSIBLE STORAGE OF HYDROGEN

(71) Applicants: Piotr Kula, Lodz (PL); Antoni Rzepkowski, Lodz (PL); Robert Pietrasik, Brzeziny (PL); Radomir Atraszkiewicz, Lodz (PL); Konrad Dybowski, Aleksandroíj (PL); Lukasz Kaczmarek, Lodz (PL); Wojciech Modrzyk, Zielona Gora (PL)

(72) Inventors: Piotr Kula, Lodz (PL); Antoni Rzepkowski, Lodz (PL); Robert Pietrasik, Brzeziny (PL); Radomir Atraszkiewicz, Lodz (PL); Konrad Dybowski, Aleksandroíj (PL); Lukasz Kaczmarek, Lodz (PL); Wojciech Modrzyk, Zielona Gora (PL)

(73) Assignees: SECO/WARWICK S.A., Swiebodzin (PL); POLITECHNIKA LÓDZKA, Lodz (PL)

( * ) Notice: Subject to any disclaimer, the term of this patent is extended or adjusted under 35 U.S.C. 154(b) by 276 days.

(21) Appl. No.: 14/074,130

(22) Filed: Nov. 7, 2013

(65) Prior Publication Data
US 2015/0125694 A1    May 7, 2015

(51) Int. Cl.
*C30B 29/02* (2006.01)
*C01B 3/00* (2006.01)
*C01B 32/182* (2017.01)

(52) U.S. Cl.
CPC ............ *C30B 29/02* (2013.01); *C01B 3/0021* (2013.01); *C01B 32/182* (2017.08); *Y02E 60/32* (2013.01); *Y10T 428/2925* (2015.01)

(58) Field of Classification Search
CPC ............ C01B 31/04; C01B 3/00; C30B 29/02; B32B 15/04
See application file for complete search history.

(56) References Cited

U.S. PATENT DOCUMENTS

| | | |
|---|---|---|
| 6,294,142 B1 | 9/2001 | Nazri |
| 2004/0191589 A1 | 9/2004 | Katamura et al. |
| 2004/0247957 A1 | 12/2004 | Hatano et al. |
| 2005/0075245 A1 | 4/2005 | Goddard, III et al. |
| 2010/0125038 A1 | 5/2010 | Bourlinos et al. |

(Continued)

FOREIGN PATENT DOCUMENTS

EP    2 865 637 B1    12/2017

OTHER PUBLICATIONS

Bacon R., Growth, Structure and Properties of Graphite Whiskers); Journal of Applied Physics 31, 283-290; 1960.*

(Continued)

*Primary Examiner* — Jennifer A Chriss
*Assistant Examiner* — Ricardo E Lopez
(74) *Attorney, Agent, or Firm* — Oliff PLC

(57) ABSTRACT

A nanocomposite for the reverse storage of hydrogen based on monolayer sheets of polycrystalline or monocrystalline grapheme having a form of a cylindrical spiral roll of polycrystalline or monocrystalline graphene with a preferably constant spacing in the range from 0.2 to 2 nm, whereby the said spiral roll of polycrystalline graphene has grains with a minimum diameter of 50 nm.

5 Claims, 1 Drawing Sheet

(56) References Cited

U.S. PATENT DOCUMENTS

| | | | | |
|---|---|---|---|---|
| 2010/0218801 A1* | 9/2010 | Sung | ................... | B82Y 30/00 |
| | | | | 136/244 |
| 2011/0008239 A1 | 1/2011 | Zhang | | |
| 2012/0282419 A1* | 11/2012 | Ahn | ................... | B82Y 30/00 |
| | | | | 428/34.8 |
| 2013/0240830 A1* | 9/2013 | Seacrist | ............ | H01L 21/02458 |
| | | | | 257/9 |
| 2014/0154941 A1* | 6/2014 | Zhamu | ................... | H01B 1/04 |
| | | | | 442/136 |

OTHER PUBLICATIONS

CVD Graphene; delaFuent J., Graphanea Jun. 2016.*
CVD-Graphene; J. de la Fuente.*

\* cited by examiner

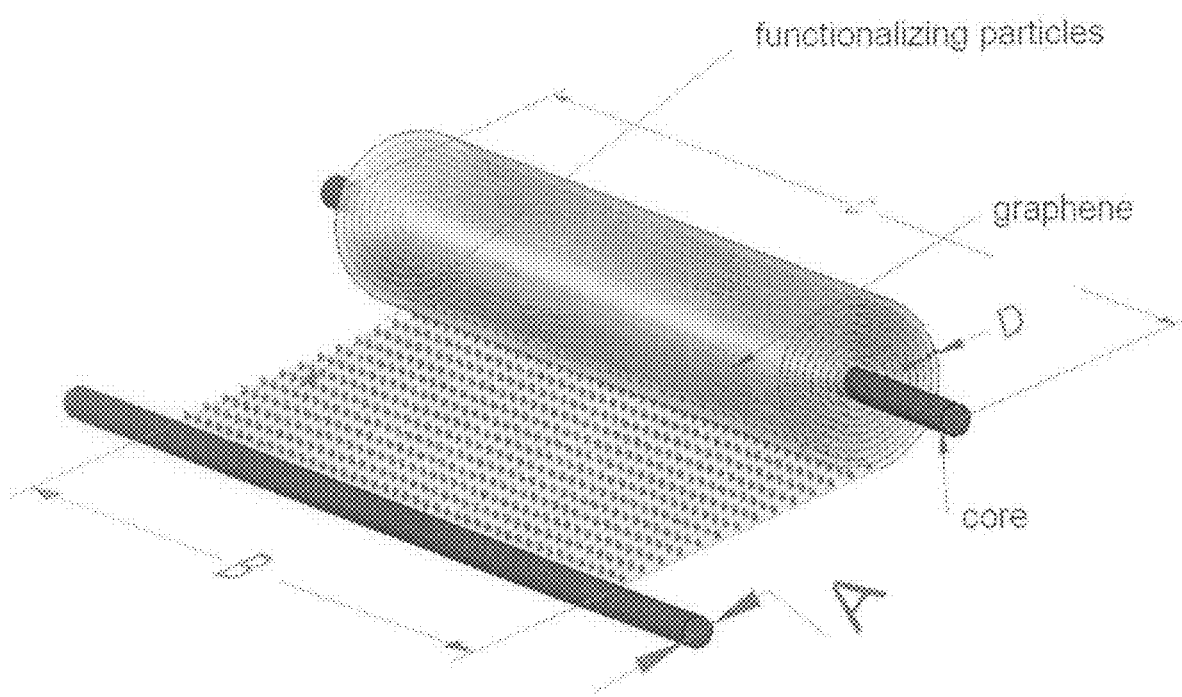

NANOCOMPOSITE BASED ON GRAPHENE FOR REVERSIBLE STORAGE OF HYDROGEN

CROSS REFERENCE TO RELATED APPLICATIONS

This application relies on the Polish Patent Application No. P.399126, filed May 9, 2012.

FIELD OF THE INVENTION

The present invention relates to a graphene-based nanocomposite for the reverse storage of hydrogen. More particularly, the present invention is directed to a nanocomposite based on monolayer sheets of polycrystalline or monocrystalline graphene.

BACKGROUND OF THE INVENTION

Being a clean source of energy, hydrogen is an attractive fuel of the future. Available methods of hydrogen storage, however, pose a set of problems. Four hydrogen storage techniques are currently known and used: in the liquid state; in the gaseous state, compressed under high pressure; using cryo-adsorption and in metal hydrides. The main shortcoming of the solutions listed above is the weight of hydrogen storage systems. The problem can be resolved by using hydrogen storage methods based on carbon materials. Conventional graphite-based carbon materials are not particularly attractive in terms of storage because a single hydrogen molecule is larger than the gaps in the aromatic carbon structures, chiefly benzene. A system based on such a solution would only be capable of storing ca. 1 wt. % of hydrogen. This is considerably below expectations, since satisfactory hydrogen storage capacity starts at 6.5 wt. %, as a minimum.

Such capacity can be achieved by storing hydrogen in nanostructures formed by carbon allotropes including nanotubes, fullerenes or graphene. Carbon-based storage systems make use of the process of hydrogen sorption taking place due to cyclical changes in temperature and/or pressure. In general terms, a reduction in temperature or an increase in partial pressure of hydrogen enhances hydrogen absorption. Conversely, hydrogen desorption can be induced by increasing temperature or reducing pressure.

Known are also multilevel parking lot GOF structures formed from oxidized graphene sheets stacked atop one another and bonded together with space maintained between consecutive layers. The structure, though capable of storing larger amounts of hydrogen, has a considerable size.

Known from the patent description no. US 2005/0075245 are carbon-based compositions designed for hydrogen storage, comprising spatially structured pillared carbon materials doped with metals in the pillars located between the layers. Metals can be selected from alkali metals, i.e. Li, Na, K, Be, Mg, Ca, and their combinations. The carbon material can be selected from graphite, more advantageously graphene, and other carbon nanostructures (nanofibers, nanotubes, etc.). The atomic proportion of the metal to the carbon atoms is in the range of about 1:3 to about 1:24 (most advantageously between 1:3 and 1:6). The optimum distance between the layers of the carbon material ranges from 6 Å to 12 Å. The hydrogen storage capacity of the configuration is at least 6.5 wt. % at 25° C. and a pressure of about 10 bar. The method of making the hydrogen storage composition involves providing a solvated alkali metal containing organic ligands which, as a result of reaction with the carbon material, form a pillared material, whereby the above-mentioned alkali metal is solvated in an organic heterocyclic solvent (ether or 2,5-dihydrofuran).

Another method of hydrogen storage, also based on carbon materials, is the pyrolysis product of a molecular precursor—a cyclic quinone compound, as described in the patent application US 2010/0125038. The pyrolysis product may be combined with selected atoms of transition metals which may be dispersed on the surface of the material. The metallic nanoparticles may also react with another metal as alloys to further improve the hydrogen storage capacity. The diameter of the nanoparticles is in the 1 nm to 100 nm range. The material for hydrogen storage based on a quinone compound contains at least two ketone groups, at least one metal alkoxide and—optionally—a halogen atom. The product of pyrolysis is capable of sorbing hydrogen at a level of 10 wt. % at the pressures of 1-80 bars and ambient temperatures.

The patent description no. US 2004/0247957 presents a simple storage method comprising a structure formed by multiple layers (sheets) of graphene oriented in a disordered fashion. Graphene sheets are obtained from an organic polymer material (polyacrylonitrile (PAN) or polyimide) subjected to heat treatment at a temperature within the 500 to 1,000° C. range, under inert gas conditions, followed by mechanical grinding. Aside from PAN and polyimide, other polymers can also be used, including rayon, polyvinyl alcohol, polyamide, phenol, polyvinyl chloride, polyvinylidene chloride, polybutadiene, etc.

Also known is a hydrogen storage system based on the carbon nanotubes structure, as described in the patent application no. US 2004/0191589. The method involves the use of single-walled carbon nanotubes (SWNT) and multi-walled carbon nanotubes (MWNT) with open walls, so that it is possible to utilize the internal surface as well. Selective opening of lateral walls is achieved in the process of oxidation performed in nitric acid, sulphuric acid, hydrochloric acid, a hydrogen peroxide solution or an oxidizing gas based on oxygen, ozone, chlorine, chlorine dioxide, bromine, iodine, nitrogen oxide and sulphur oxide. The structure is based on a bundle of open carbon nanotubes which allows hydrogen absorption in the spaces between the nanotubes and in the internal surfaces of the tubes. Despite demonstrating that the theoretical hydrogen storage capacity of the nanotubes can reach up to 10 wt. %, the maximum capacity obtained in the examples presented in the patent description was 1.12 wt. %. Another nanotube-based hydrogen storage solution is described in the patent application no. US 2011/0008239. The claims of the patent refer to a method of storing hydrogen with an aid of nanotubes having a specified diameter selectable from the 0.5 nm-0.8 nm range. The claims regarding nanotube diameters are related to the fact that the inventors have determined that the diameter of the nanotubes has an important effect on hydrogen absorption and storage properties.

Yet another method of carbon-based hydrogen storage is described in the patent description no. U.S. Pat. No. 6,294,142. The method of hydrogen storage utilizes the absorption properties of the product of reaction of an alkali metal and graphite. The alkali metal is selected from the group of lithium, sodium or potassium. According to the method, a mixture is prepared containing six to 24 atoms of carbon (graphite) per one atom of the selected alkali metal. The mixture is heat-treated under inert gas atmosphere, producing completely intercalated alkali metal atoms between graphite planes. A graphite-metal composite is thus formed.

The hydrogen storage capacity of the composite can reach up to one third of its original weight. The process is reversible. Similarly to other storage solutions, hydrogen absorption or desorption can be induced by temperature and/or pressure changes.

Nature of the Invention

The essence of the nanocomposite according to the proposed invention is that the material, produced from graphene sheets, has the shape of a cylindrical spiral roll of polycrystalline or monocrystalline graphene with a pitch, advantageously constant, in the range from 0.2 to 2 nm, whereby the spiral roll of polycrystalline graphene has a grain size not smaller than 50 nm.

Advantageously, the roll of polycrystalline or monocrystalline graphene is wound on a core with a diameter from 1 nm to 20 µm.

Furthermore, it is advantageous for the roll of polycrystalline or monocrystalline graphene to be wound consecutively from a single sheet or multiple sheets (from 2 to 50,000).

It is also advantageous for the external diameter of the roll to be within the range from 500 nm to 5 mm.

It is furthermore advantageous for the width of the roll to be within the range from 0.05 to 1,000 mm.

It is also advantageous for metal and/or nonmetal carbide particles, advantageously carbides of Ca, Al, Li, B and Si, to occupy spaces existing between consecutive layers within the roll.

It is furthermore advantageous for metal and/or nonmetal carbide particles to contain between 1 and 5 molecules.

It is furthermore advantageous for metal and/or nonmetal carbide particles to cover between 0.1% and 5% of the internal surface of the spiral roll.

The nanocomposite according to the present invention is characterized by very good hydrogen sorption and desorption. Additionally, the cost of producing the material is relatively low thanks to the possibility of using relatively simple technologies.

BRIEF DESCRIPTION OF THE DRAWING

FIG. 1 illustrates a partially unwound roll of the nanocomposite in a perspective view.

DETAILED DESCRIPTION OF THE INVENTION

The proposed invention will be outlined in detail on the basis of the examples of embodiment shown in a drawing representing a partially unwound roll of the nanocomposite in a perspective view.

The spiral layers of the roll are wound on a core and have a shape approximating the Archimedean spiral. The internal surface of the roll is coated with functionalizing particles.

The indicators shown in the drawing denote the following parameters:
A—diameter of the core and external fiber,
B—width of the graphene sheet,
C—length of the core and external fiber, and
D—pitch of the spiral.

Example 1

A multilayered sheet measuring 100×600 mm, containing on the external surface a single layer of polycrystalline graphene with a grain size ranging between 100 to 120 nm, formed on a bimetallic substrate of copper and platinum, was placed in the vacuum chamber of a plasma-chemical reactor equipped with pulsed laser and a target made of aluminum carbide $Al_4C_3$. After reducing the pressure in the reactor chamber to the level of $10^{-6}$ Pa, three nanosecond laser pulses were focused onto the target surface, causing $Al_4C_3$ ablation and applying particles separated from the target to the graphene-side exposed surface of the plate. After removing the plate from the reactor chamber a polymethyl methacrylate film was attached to the plate surface and copper was selectively etched from the space between platinum and PMMA, obtaining a graphene sheet functionalized with $Al_4C_3$ particles, on a PMMA carrier, measuring 100×600 mm. Carbon cores, 140 mm long and with a diameter of 5 µm, were then attached by thermal welding to the two short sides of the graphene sheet. The PMMA carrier was subsequently dissolved in acetone and dried. Functionalized graphene was then rolled into a spiral roll, at which point the external fiber was separated by cutting, and the core section extending beyond the roll was severed. The roll thus prepared was heated under a vacuum of $10^{-6}$ Pa at a temperature of 600° C. for 15 minutes. Ultimately, a roll was obtained with the following parameters: external dimensions—diameter: 30 µm, length: 100 mm, weight—66 µg, density—0.76 g/cm$^3$. By comparing the external diameter of the roll and the diameter of the core, the pitch of the spiral line of functionalized graphene was determined to be 0.59 nm. Analyzing the density of the roll and taking into account the weight of the carbon fiber and the weight of the graphene layer, it was estimated that $Al_4C_3$ particles had functionalized ca. 2.04% of the internal surface of the roll.

The roll of functionalized polycrystalline graphene thus produced was then subjected to hydrogen (99.996% pure) at a pressure of 5 MPa. Subsequently, an assessment was performed of the quantity of hydrogen absorbed by a roll weighing 66 µg, by conducting measurements of IR energy absorption after complete combustion in a stream of inert gas. The weight of the test sample was complemented by a "blind sample" of spectrally pure silicon. The blind sample weighed ca. 250 mg. The analysis of hydrogen content produced the result of 16 ppm, which—with respect to the weight of the analyzed sample—is equivalent to ca. 7 wt. % of hydrogen.

Example 2

Five multilayered sheets measuring 100×600 mm, containing on the external surface a single layer of polycrystalline graphene with a grain size ranging from 100 to 120 nm, formed on a bimetallic substrate of copper and platinum, were placed successively in the vacuum chamber of a plasma-chemical reactor equipped with a two-electrode target composed of amorphous silicon carbide (SiC) and a spark-ignited target spraying system based on the discharges of a 4 µF capacitor. After reducing the pressure in the reactor chamber to the level of $10^{-6}$ Pa and filling it with argon to the pressure of 10 hPa, five cycles of capacitor charging and spark-activated discharging were performed, achieving SiC ablation and applying particles separated from the target to the graphene-side exposed surface of the plate. After removing the plate from the reactor chamber a polymethyl methacrylate film was attached to the plate surface and copper was selectively etched from the space between platinum and PMMA, obtaining a graphene sheet functionalized with SiC particles, on a PMMA carrier, measuring 100×600 mm. Carbon cores, 140 mm long and with a diameter of 8 µm, were then attached by thermal welding to the two short sides of each graphene sheet. The PMMA carrier was then dissolved in acetone and the sheet was dried. The first functionalized graphene sheet was then rolled into a spiral roll, at which point the external fiber was separated by cutting. Subsequent sheets were first thermally attached to the roll, whereupon the initial fiber was cut off and roll winding was continued. After the fifth sheet was wound up the last external fiber was detached and the core section extending beyond the roll was cut off. The roll thus prepared was heated under a vacuum of $10^{-6}$ Pa at a temperature of 680° C. for 15 minutes. Ultimately, a roll was obtained with the following parameters: external dimensions—diameter: 65 µm, length: 100 mm, weight—340 µg, density—1.02 g/cm$^3$. By comparing the external diameter of the roll and the diameter of the core, the pitch of the spiral line of functionalized graphene was determined to be 0.68 nm. Analyzing the density of the roll and taking into account the weight of the carbon fiber and the weight of the graphene layer, it was estimated that SiC particles had functionalized ca. 4% of the internal surface of the roll.

The roll of functionalized polycrystalline graphene thus produced was then subjected to hydrogen (99.996% pure) at a pressure of 5 MPa. Subsequently, an assessment was performed of the quantity of hydrogen absorbed by a roll weighing 340 µg, by conducting measurements of IR energy absorption after complete combustion in a stream of inert gas. The weight of the test sample was complemented by a "blind sample" of spectrally pure silicon. The blind sample weighed ca. 250 mg. The analysis of hydrogen content produced the result of 16 ppm, which—with respect to the weight of the analyzed sample—is equivalent to ca. 6.5 wt. % of hydrogen.

The invention claimed is:

1. A nanocomposite for the reverse storage of hydrogen in the form of a cylindrical spiral roll which is made from at least a single monolayer sheet of polycrystalline or monocrystalline functionalized graphene with constant separating spacing, wherein
   the cylindrical spiral roll is wound up onto a carbon core with a diameter in the range of 1 nm to 20 µm;
   the cylindrical spiral roll is composed of at most 50 000 polycrystalline or monocrystalline functionalized graphene sheets;
   the cylindrical spiral roll has a separating spacing in the range of 0.2 to 2 nm;
   the cylindrical spiral roll has an external diameter in the range of 500 nm to 5 mm;
   the cylindrical spiral roll has a width in the range of 0.05 to 1000 mm;
   the cylindrical spiral roll has functionalized graphene grains with a minimum diameter of 50 nm;
   the separating spacing is maintained by metal carbide particles and/or non-metal carbide particles that are located in the space between consecutive layers and that cover from 0.1% to 5% of the inner surface of the cylindrical spiral roll;
   the particles of carbides contain from 1 to 5 molecules;
   the carbides are selected from the group consisting of Ca, Al, Li, B and Si carbide; and
   the nanocomposite has a minimum hydrogen storage capacity under a pressure of 5 MPa of 6.5 wt %, wherein
   the functionalized graphene sheets are formed by functionalizing the graphene sheets with the carbide particles on a single layer of graphene formed on a bimetallic substrate of copper and platinum, after which the copper is selectively etched.

2. The nanocomposite according to claim 1, wherein when:
   the cylindrical spiral roll is 100 mm wide and with the diameter of 30 µm, is made from a single monolayer sheet of polycrystalline graphene that is wound up onto a carbon core with a diameter of 5 µm;
   the monolayer sheet of polycrystalline graphene has grains with size ranging from 100 to 120 nm;
   the monolayer sheet of polycrystalline graphene measuring 100×600 mm is functionalized with $Al_4C_3$ particles which cover 2.04% of the inner surface of the cylindrical spiral roll;
   the width of the separating spacing of the cylindrical spiral roll is 0.59 nm; and
   the cylindrical spiral roll has a hydrogen content of 16 ppm, which is equivalent to about 7.0 wt. % of hydrogen.

3. The nanocomposite according to claim 1, wherein when:
   the cylindrical spiral roll is 100 mm wide and with the diameter of 65 µm, is made from five monolayer sheets of polycrystalline graphene joined by thermal welding and wound up onto a carbon core with the diameter of 8 µm;
   the monolayer sheets of polycrystalline graphene have grains with size ranging from 100 to 120 nm;
   the monolayer sheets of polycrystalline graphene measuring 100×600 mm are functionalized with SiC particles which cover 4% of the inner surface of the cylindrical spiral roll; and
   the width of the separating spacing of the cylindrical spiral roll is 0.68 nm; and
   the cylindrical spiral roll has a hydrogen content of 16 ppm, which is equivalent to about 6.5 wt. % of hydrogen.

4. The nanocomposite according to claim 1, wherein the carbide particles are of $Al_4C_3$.

5. The nanocomposite according to claim 1, wherein the carbide particles are of SiC.

* * * * *